United States Patent
Kao et al.

(10) Patent No.: US 9,112,004 B2
(45) Date of Patent: Aug. 18, 2015

(54) BARRIER LAYER FOR COPPER INTERCONNECT

(71) Applicant: Taiwan Semiconductor Manufacturing Company, Ltd., Hsin-Chu (TW)

(72) Inventors: Chih-Kuang Kao, Chu-pei (TW); Huei-Wen Yang, Hsin-Chu (TW); Yung-Sheng Huang, Hsin-Chu (TW); Yu-Wen Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/132,651

(22) Filed: Dec. 18, 2013

(65) Prior Publication Data

US 2014/0106562 A1    Apr. 17, 2014

Related U.S. Application Data

(63) Continuation of application No. 12/757,325, filed on Apr. 9, 2010, now Pat. No. 8,653,663.

(60) Provisional application No. 61/256,168, filed on Oct. 29, 2009.

(51) Int. Cl.
*H01L 21/768* (2006.01)
*H01L 23/532* (2006.01)

(52) U.S. Cl.
CPC .... *H01L 21/76864* (2013.01); *H01L 23/53238* (2013.01); *H01L 23/53295* (2013.01)

(58) Field of Classification Search
None
See application file for complete search history.

(56) References Cited

U.S. PATENT DOCUMENTS

| 5,904,565 | A | 5/1999 | Nguyen et al. |
| 5,969,422 | A | 10/1999 | Ting et al. |
| 6,181,012 | B1 * | 1/2001 | Edelstein et al. ............. 257/762 |
| 6,249,055 | B1 | 6/2001 | Dubin |
| 6,498,090 | B2 | 12/2002 | Morozumi |
| 6,498,098 | B1 | 12/2002 | Abe |
| 6,743,310 | B1 * | 6/2004 | Ngo .............................. 148/525 |
| 6,836,017 | B2 | 12/2004 | Ngo et al. |
| 7,026,238 | B2 | 4/2006 | Xi et al. |
| 7,034,297 | B2 | 4/2006 | Petrov et al. |
| 7,413,977 | B2 | 8/2008 | Shimizu et al. |
| 7,485,915 | B2 | 2/2009 | Nasu et al. |

(Continued)

FOREIGN PATENT DOCUMENTS

| JP | 2008047719 | 2/2008 |
| JP | 2008060431 | 3/2008 |
| JP | 2008066428 | 3/2008 |

OTHER PUBLICATIONS

Iijima, J. et al., "Growth Behavior of Self-Formed Barrier Using Cu-Mn Alloys at 350 to 600 C," Interconnect Technology Conference, IEEE Jun. 2006, pp. 155-157.

(Continued)

*Primary Examiner* — Evan Pert
*Assistant Examiner* — Shaka White
(74) *Attorney, Agent, or Firm* — Slater & Matsil, L.L.P.

(57) ABSTRACT

A copper interconnect includes a copper layer formed in a dielectric layer. A glue layer is formed between the copper layer and the dielectric layer. A barrier layer is formed at the boundary between the glue layer and the dielectric layer. The barrier layer is a metal oxide.

20 Claims, 3 Drawing Sheets

(56) References Cited

U.S. PATENT DOCUMENTS

| | | |
|---|---|---|
| 7,713,869 B2 | 5/2010 | Kitada et al. |
| 7,727,888 B2 | 6/2010 | Yang et al. |
| 7,786,006 B2 | 8/2010 | Suzuki |
| 7,795,141 B2 | 9/2010 | Shimizu et al. |
| 7,795,733 B2 | 9/2010 | Tsumura et al. |
| 8,017,523 B1 | 9/2011 | Wu et al. |
| 8,072,075 B2 | 12/2011 | Jourdan et al. |
| 8,198,732 B2 | 6/2012 | Kageyama |
| 8,258,058 B2 | 9/2012 | Matsuda et al. |
| 2004/0026783 A1* | 2/2004 | Kloster et al. ............... 257/758 |
| 2007/0049024 A1 | 3/2007 | Nakao et al. |
| 2007/0148944 A1 | 6/2007 | Lee |
| 2007/0293049 A1 | 12/2007 | Minamihaba et al. |
| 2008/0054467 A1 | 3/2008 | Ohba et al. |
| 2008/0142974 A1 | 6/2008 | Arakawa |
| 2008/0173547 A1 | 7/2008 | Ohba et al. |
| 2008/0179747 A1 | 7/2008 | Sakai et al. |
| 2008/0213998 A1 | 9/2008 | Nagai et al. |
| 2008/0230375 A1 | 9/2008 | Maekawa et al. |
| 2009/0206485 A1 | 8/2009 | Yang et al. |
| 2009/0209099 A1 | 8/2009 | Yu et al. |
| 2010/0171220 A1 | 7/2010 | Huang |
| 2010/0227473 A1 | 9/2010 | Matsuda et al. |
| 2010/0320604 A1 | 12/2010 | Isobayashi |
| 2010/0323514 A1 | 12/2010 | Isobayashi et al. |
| 2011/0006429 A1 | 1/2011 | Liu et al. |
| 2011/0049718 A1 | 3/2011 | Matsumoto et al. |
| 2011/0057317 A1 | 3/2011 | Koike et al. |
| 2011/0100697 A1 | 5/2011 | Yang et al. |
| 2011/0233780 A1 | 9/2011 | Gordon et al. |
| 2011/0256715 A1 | 10/2011 | Pan et al. |
| 2011/0266676 A1 | 11/2011 | Isobayashi |
| 2012/0025380 A1 | 2/2012 | Neishi et al. |
| 2012/0164826 A1 | 6/2012 | Matsuda et al. |
| 2012/0269987 A1 | 10/2012 | Dordi et al. |

OTHER PUBLICATIONS

Kudo, H. et al., "Further Enhancement of Electro-Migration Resistance by Combination of Self-Aligned Barrier and Copper Wiring Encapsulation Techniques for 32-nm Nodes and Beyond," Interconnect Technology Conference, IEEE Jun. 2008, pp. 117-119.

Kudo, H. et al., Copper Wiring Encapsulation with Ultra-Thin Barriers to Enhance Wiring and Dielectric Reliabilities for 32-nm Noes and Beyond, Electron Devices Meeting, IEEE Dec. 2007, pp. 513-516.

Ohoka, Y. et al., "Integration of High Performance and Low Cost Cu/Ultra Low-k SiOC (k=2.0) Interconnection with Self-Formed Barrier Technology for 32nm-node and Beyond," International Interconnect Technology Conference, IEEE Jun. 2007, pp. 67-69.

Usui, T. et al., "High Performance Ultra Low-k (k=2.0keff-2.4)/Cu Dual-Damascene Interconnect Technology with Self-Formed MnSixOy Barrier for 32 nm-node," Interconnect Technology Conference, IEEE Jun. 2006, pp. 216-218.

\* cited by examiner

BARRIER LAYER FOR COPPER INTERCONNECT

This application is a continuation of U.S. patent application Ser. No. 12/757,325, entitled "Barrier Layer for Copper Interconnect," filed on Apr. 9, 2010, which application claims the benefit of U.S. Provisional Application No. 61/256,168, filed Oct. 29, 2009 entitled, "Barrier Layer for Copper Interconnect" which applications are hereby incorporated herein by reference.

CROSS REFERENCE

The present disclosure is related to the following commonly-assigned U.S. patent applications, the entire disclosures of which are incorporated herein by reference: U.S. Application No. 61/223,884 entitled, "Barrier Layers for Copper Interconnect," filed Jul. 8, 2009 and U.S. application Ser. No. 12/832,790, entitled "Barrier Layers for Copper Interconnect" filed Jul. 8, 2010.

TECHNICAL FIELD

The present invention relates to semiconductor devices, and particularly to copper interconnects and methods for their fabrication.

BACKGROUND

Semiconductor devices are used in a variety of electronic applications, such as personal computers, cell phones, digital cameras, and other electronic equipment, as examples. As technology has progressed, the demand for smaller semiconductor devices with improved performance has increased. As feature densities increase, the widths of the conductive lines, and the spacing between the conductive lines of back-end of line (BEOL) interconnect structures also need to scale smaller.

A move is being made away from the traditional materials used in the past in semiconductor device designs, in order to meet these demands. To reduce the RC time delay, low dielectric constant (low-k) materials are being used as insulating materials, and there is a switch being made to the use of copper for interconnect materials, rather than aluminum. Advantages of using copper for semiconductor device interconnects include abilities to operate faster and manufacture thinner conductive lines because copper has lower resistivity and increased electromigration resistance compared to aluminum. Combining copper interconnects with low-k dielectric materials increases interconnect speed by reducing the RC time delay, for example.

Copper interconnects are often formed using damascene processes rather than by direct etching. Damascene processes are typically either single or dual damascene, which includes forming openings by patterning and etching inter-metal dielectric (IMD) layers and filling the openings with copper. Because copper diffuses easily into some dielectric materials, especially some types of low-k dielectric materials, a diffusion barrier layer is usually deposited on the inner walls of the damascene opening before the copper is formed. Refractory metals such as tantalum (Ta) or titanium (Ti), or nitride compounds of these metals are used as materials of the diffusion barrier layer. However, there are some challenges in using refractory metals in the copper damascene structure since these metallic films have high resistance, thereby causing increased resistance in the copper lines and increased RC delay, especially in small, narrow features.

As the shrinkage of copper lines has progressed in recent years, there is a trend towards thinner films being used for the diffusion barrier layer. Physical vapor deposition (PVD) process used for depositing a thinner TaN/Ta barrier layer encounters difficulties in advanced scale of interconnection. Atom layer deposition (ALD) process is the candidate to deposit a very thin diffusion barrier layer with uniform coverage, but the ALD method is disadvantageous in extremely low deposition rate and poor throughput. In addition, in manufacturing the TaN/Ta film, a problem occurs in which favorable adhesion between diffusion barrier layer and the IMD layer cannot be achieved. For example, copper lines peel off at the interface, worsening the yield of the semiconductor device.

Therefore, there is a need for an improved diffusion barrier layer in the copper interconnect, and a method of forming thereof.

BRIEF DESCRIPTION OF THE DRAWING

For a more complete understanding of the present invention, and the advantages thereof, reference is now made to the following descriptions taken in conjunction with the accompanying drawing, in which.

DETAILED DESCRIPTION

Figure 1:
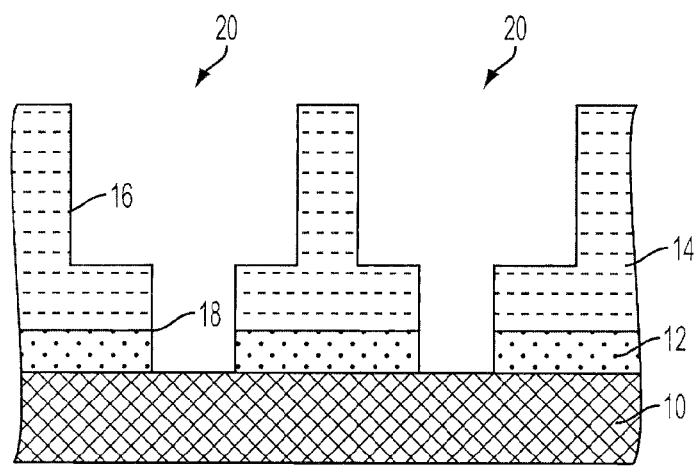
FIGS. 1 to 7 are cross-sectional diagrams illustrating an exemplary embodiment of a copper interconnect.

Embodiments provide a barrier layer formed in a copper interconnect structure of a semiconductor device and methods of forming thereof, which has wide applicability to many manufacturers, factories and industries, including integrated circuit fabrications, microelectronic fabrications, and optical electronic fabrications. Reference will now be made in detail to the present embodiments, examples of which are illustrated in the accompanying drawings. Wherever possible, the same reference numbers are used in the drawings and the description to refer to the same or like parts. In the drawings, the shape and thickness of one embodiment may be exaggerated for clarity and convenience. This description will be directed in particular to elements forming part of, or cooperating more directly with, apparatus in accordance with the present invention. It is to be understood that elements not specifically shown or described may take various forms well known to those skilled in the art. Further, when a layer is referred to as being on another layer or "on" a substrate, it may be directly on the other layer or on the substrate, or intervening layers may also be present.

With reference now to FIG. 1, a semiconductor substrate 10 is provided with a stacked dielectric structure including a first etch stop layer 12 and an inter-metal dielectric (IMD) layer 14 formed thereon, and openings 20 formed in the stacked dielectric structure. The semiconductor substrate 10 is a substrate as employed in a semiconductor integrated circuit fabrication, and integrated circuits may be formed therein and/or thereupon. The term "semiconductor substrate" is defined to mean any construction comprising semiconductor material, for example, a silicon substrate with or without an epitaxial layer, a silicon-on-insulator substrate containing a buried insulator layer, or a substrate with a silicon germanium layer. The term "integrated circuits" as used herein refers to electronic circuits having multiple individual circuit elements, such as transistors, diodes, resistors, capacitors, inductors, and other active and passive semiconductor devices. A conductive region formed in and/or on the semiconductor substrate 10 is a portion of conductive routes and has exposed surfaces that may be treated by a planarization process, such as chemical mechanical polishing. Suitable materials for the conductive regions may include, but not limited to, for example copper, aluminum, copper alloy, or other mobile conductive materials. Copper interconnect level may be the first or any subsequent metal interconnect level of the semiconductor device.

The first etch stop layer 12 for controlling the end point during subsequent etching processes is deposited on the above-described semiconductor substrate 10. The first etch stop layer 12 may be formed of silicon oxide, silicon nitride, silicon carbide, silicon oxynitride or combinations thereof, with a thickness of about 10 angstroms to about 1000 angstroms, which may be formed through any of a variety of deposition techniques, including, LPCVD (low-pressure chemical vapor deposition), APCVD (atmospheric-pressure chemical vapor deposition), PECVD (plasma-enhanced chemical vapor deposition), PVD (physical vapor deposition), sputtering, and future-developed deposition procedures.

The IMD layer 14 may be a single layer or a multi-layered structure. The thickness of the IMD layer 14 varies with the applied technology, for example a thickness of about 1000 angstroms to about 30000 angstroms. In an embodiment, the IMD layer 14 is an oxygen-containing dielectric layer. The IMD layer 14 may be formed of $SiO_2$, carbon-doped $SiO_2$, a comparatively low dielectric constant (k value) dielectric material with a k value less than about 4.0, or combinations thereof. The IMD layer 14 may be formed of a low-k dielectric material, an extreme low-k dielectric material, a porous low-k dielectric layer, and combinations thereof. The term "low-k" is intended to define a dielectric constant of a dielectric material of 3.0 or less. The term "extreme low-k (ELK)" means a dielectric constant of 2.5 or less, and preferably between 1.9 and 2.5. The term "porous low-k" refers to a dielectric constant of a dielectric material of 2.0 or less, and preferably 1.5 or less. A wide variety of low-k materials may be employed in accordance with embodiments, for example, spin-on inorganic dielectrics, spin-on organic dielectrics, porous dielectric materials, organic polymer, organic silica glass, FSG (SiOF series material), HSQ (hydrogen silsesquioxane) series material, MSQ (methyl silsesquioxane) series material, or porous organic series material. The IMD layer 14 is deposited through any of a variety of techniques, such as chemical vapor deposition (CVD), physical vapor deposition (PVD), atomic layer deposition (ALD), remote plasma enhanced chemical vapor deposition (RPECVD), liquid source misted chemical deposition (LSMCD), coating, spin-coating or another process that is adapted to form a thin film layer over the substrate.

The opening 20 is an exemplary dual damascene opening 20 including an upper trench section 16 and a lower via-hole section 18 patterned in the MLD layer 14 to define a contact region on the semiconductor substrate 10. Although the embodiments illustrate dual damascene openings in the IMD layer, the use of single damascene openings in the IMD layer also provide values. In dual damascene techniques including a "via-first" patterning method or a "trench-first" patterning method, the upper trench section 16 and the lower via-hole section 18 may be formed using a typical lithographic with masking technologies and anisotropic etch operation (e.g. plasma etching or reactive ion etching). A bottom etch stop layer, a middle etch stop layer, a polish stop layer, or an anti-reflective coating (ARC) layer may be optionally deposited on or intermediately in the IMD layer 14, providing a clear indicator of when to end a particular etching process.

Figure 2:
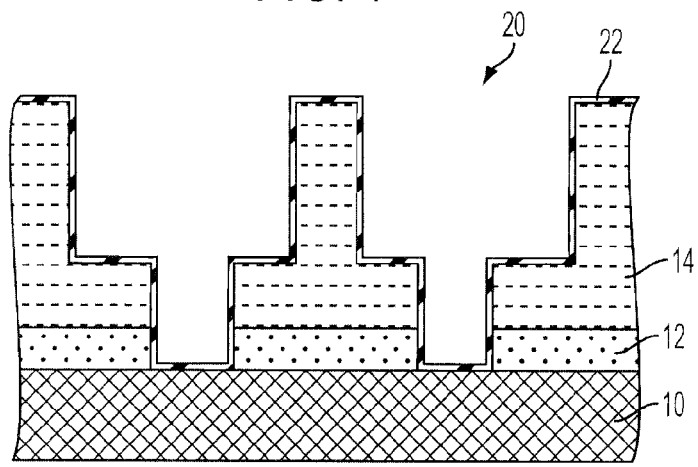

Referring to FIG. 2, a glue layer 22 is deposited on the above-described substrate 10 to line the sidewalls and bottoms of the dual damascene openings 20. In detail, the glue layer 22 lines the sidewall portions and bottom portions of the upper trench section 16 and lines the sidewall portions and bottom portions of the lower via-hole section 18. The glue layer 22 has a thickness of about 10 angstroms to about 300 angstroms, and preferably ranging from about 5 angstroms to about 30 angstroms. In one embodiment, the glue layer 22 is a metal or metal alloy layer. In another embodiment, the glue layer 22 has a resistivity lower than 1E-5 ohm-m. In another embodiment, the glue layer 22 has a melting point higher than 300° C. The glue layer 22 may include cobalt (Co), silver (Ag), aluminum (Al), zinc (Zn), calcium (Ca), gold (Au), magnesium (Mg), tungsten (W), molybdenum (Mo), nickel (Ni), chromium (Cr), or the like, which may be deposited by using e.g., physical vapor deposition (PVD), chemical vapor deposition (CVD), plasma enhanced CVD (PECVD), low pressure CVD (LPCVD), or other well-known deposition techniques.

Figure 3:
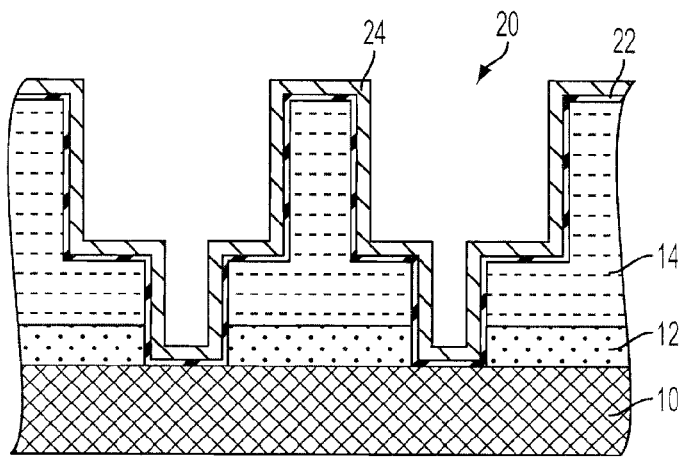

Referring to FIG. 3, a conductive seed layer 24 is formed on the glue layer 22. The conductive seed layer 24 has a thickness of about 100 angstroms to about 1000 angstroms, and preferably ranging from about 500 angstroms to about 700 angstroms. In one embodiment, the conductive seed layer 24 is a metal alloy layer containing at least a main metal element, e.g., copper (Cu), and a first additive metal element, e.g., manganese (Mn), Aluminum (Al). In another embodiment, the conductive seed layer 24 is a copper-manganese (CuMn) layer. The ratio of manganese to copper contained in the CuMn layer is not limited. In other embodiments, Ti, Al, Nb, Cr, V, Y, Tc, Re, or the like can be utilized as an another additive metal for forming the conductive seed layer 24. The conductive seed layer 24 may be deposited by using physical vapor deposition (PVD), chemical vapor deposition (CVD), plasma enhanced CVD (PECVD), low pressure CVD (LPCVD), or other well-known deposition techniques.

Figure 4:
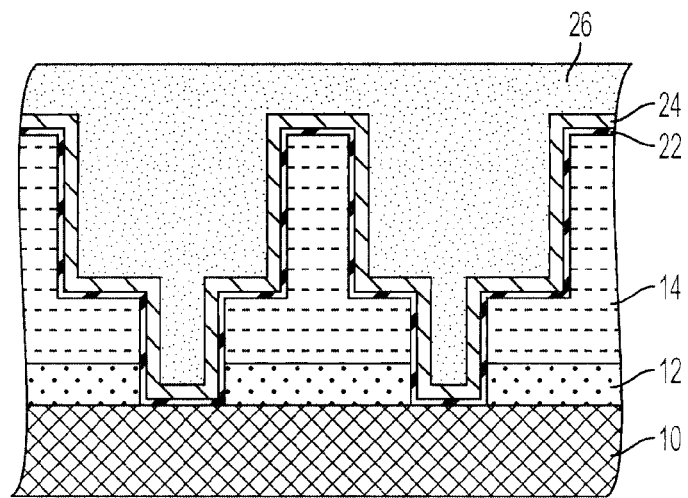

Next, in FIG. 4, for filling the dual damascene openings 20, a deposition process, for example electro-chemical plating (ECP), is carried out to form a conductive layer 26 on the conductive seed layer 24 and fill the trench section 16 and the via-hole section 18. The conductive layer 26 at least contains the main metal element, e.g., copper (Cu), as contained in the conductive seed layer 24. The conductive layer 26 may further contains a second additive metal element different from the first additive metal element, such as tantalum, indium, tin, zinc, manganese, chromium, titanium, germanium, strontium, platinum, magnesium, aluminum or zirconium.

Figure 5:
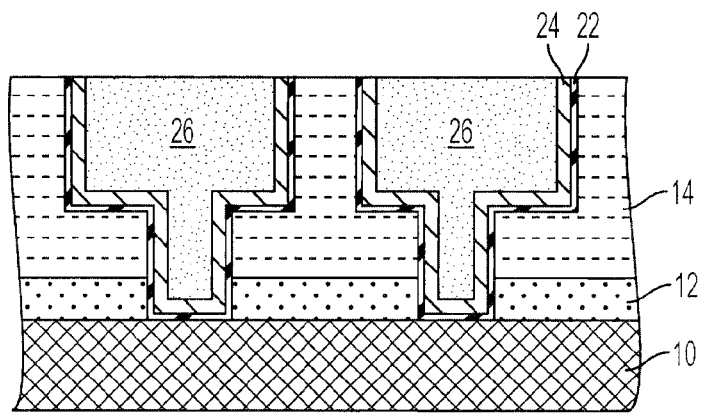

In FIG. 5, a chemical mechanical polishing (CMP) process is performed after the formation of the conductive layer 26 to remove the excess portions of the conductive layer 26, the conductive seed layer 24, and the glue layer 22 outside the dual damascene openings 20, thus exposing the top surface of the IMD layer 14 and achieving a planarized surface.

Figure 6:
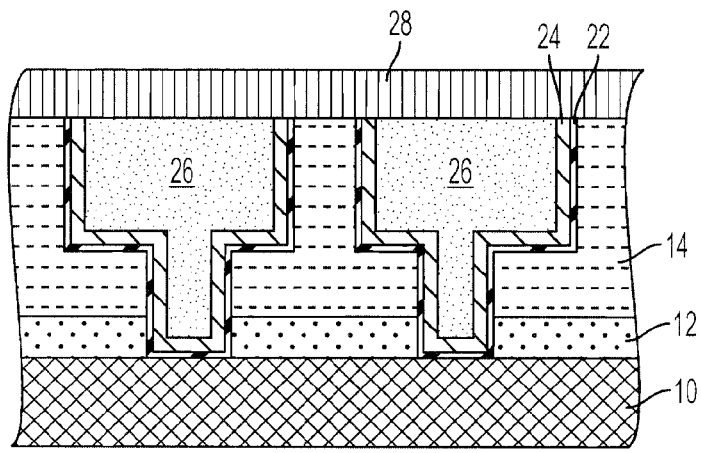

Referring to FIG. 6, a second etch stop layer 28 is formed on the above-described planarized surface. The second etch stop layer 28 may control the end point during subsequent etching processes. The second etch stop layer 28 may be formed of silicon oxide, silicon nitride, silicon carbide, silicon oxynitride or combinations thereof, with a thickness of about 10 angstroms to about 1000 angstroms, which may be formed through any of a variety of deposition techniques, including, LPCVD (low-pressure chemical vapor deposition), APCVD (atmospheric-pressure chemical vapor deposition), PECVD (plasma-enhanced chemical vapor deposition), PVD (physical vapor deposition), sputtering, and future-developed deposition procedures.

Figure 7:
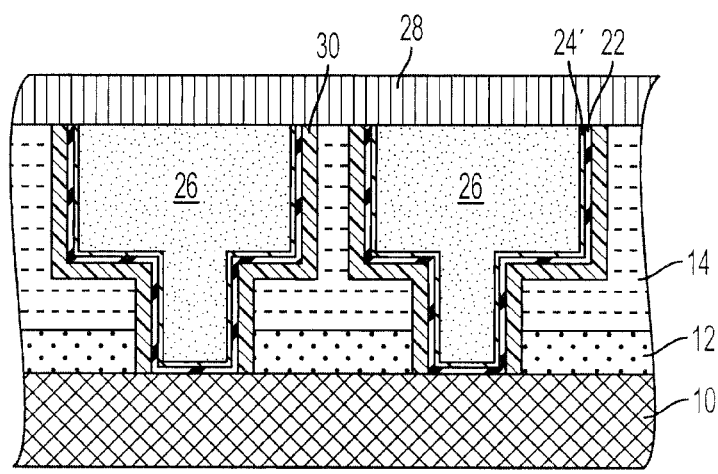

In addition, after the formation of the conductive layer 26, a thermal treatment, for example an annealing process, is performed on the substrate 10. In one embodiment, the step of thermal treatment is provided at the time immediately after the formation of the conductive layer 26. In another embodiment, the step of thermal treatment is provided at the time immediately after the step of CMP of removing the excess portions of the conductive layer 26 outside the dual damascene openings 20. In other embodiment, the step of thermal treatment is provided at the time immediately after the step of forming the second etch stop layer 28. The temperature of the annealing process is preferably ranged from about 137° C. to about 600° C., and is more preferably ranged from about 280° C. to about 400° C. The duration of the annealing process may be ranged from about 10 min. to about 600 min. by using furnace, rapid thermal processing (RTP), or hot plate equipment. During and/or after the annealing process, the first additive metal element of the conductive seed layer 24 may partially or completely, through the glue layer 22, diffuse to the interface of the glue layer 22 and the IMD layer 14 and react with the IMD layer 14. Referring to FIG. 7, a barrier layer 30 is formed by the reaction of the IMD layer 14 with the diffused first additive metal element. The barrier layer 30 is formed in a self-aligned manner at the boundary between the glue layer 22 and the IMD layer 14. The barrier layer 30 may have a thickness ranged from about 5 angstrom to about 30 angstroms, and preferably ranging from about 10 angstroms to about 20 angstroms. The formation of the barrier layer 30 may consume some of the conductive seed layer 24 and the IMD layer 14. In one embodiment, the barrier layer 30 is an oxygen-containing layer because the oxygen existed in the IMD layer 14 reacts with the first additive metal element during the annealing process. In another embodiment, the barrier layer 30 is $MnO_x$ and/or $MnSi_yO_z$. The barrier layer 30 may function as a protector to prevent the conductive layer 26 diffusing into the IMD layer 14. After the annealing process, the conductive seed layer 24 is transformed to be a post conductive seed layer 24'. In one embodiment, the post conductive seed layer 24' contains the main metal element and the first additive metal element remained therein, wherein the content of the first additive metal element in the post conductive seed layer 24' is less than the content of the first additive metal element in the conductive seed layer 24. In another embodiment, the post conductive seed layer 24' contains the main metal element but without the first additive metal element because the first additive metal element has been consumed entirely after the annealing process.

In FIG. 7, the conductive layer 26 is formed as an interconnect structure in the dual damascene openings 20 patterned in the IMD layer 14. The glue layer 22 is formed between the conductive layer 26 and the IMD layer 14. The barrier layer 30 is formed underlying the glue layer 22 and adjacent to the sidewall portions of the dual damascene opening 20. The second etch stop layer 28 is formed over the conductive layer 26 and the IMD layer 14. The post conductive seed layer 24' may be present between the conductive layer 26 and the glue layer 22. The barrier layer 30 can lower resistance and prevent copper diffusion in the conductive layer 26 to enhance BEOL SPICE performance. Thus the barrier capabilities of the conductive layer 26 in relation to the IMD layer 14 are improved. The glue layer 22 can improve the adhesion between the IMD layer 14 and the post conductive seed layer 24'/the conductive layer 26, and thus the metal peeling issue during the CMP process can be suppressed. Further, the barrier layer 30 formed in a self-aligned manner can prevent openings existing in any dielectric liner adjacent the bottom of the via-hole section, thus solving the contact issue. These can improve package capabilities.

Although the present invention has been described in its preferred embodiments, it is not intended to limit the invention to the precise embodiments disclosed herein. Those skilled in this technology can still make various alterations and modifications without departing from the scope and spirit of this invention. Therefore, the scope of the present invention shall be defined and protected by the following claims and their equivalents.

What is claimed is:

1. A method comprising:
    etching a dielectric layer to form an opening;
    depositing a glue layer to a bottom and sidewalls of the opening, wherein the glue layer comprises a metal alloy;
    depositing a seed layer over the glue layer;
    after the depositing the seed layer, filling the opening with a metallic material; and
    performing a thermal treatment to cause a metal in the seed layer to diffuse through the glue layer, wherein the metal reacts with the dielectric layer to form a barrier layer.

2. The method of claim 1, wherein the dielectric layer comprises an oxygen-containing dielectric, and wherein the barrier layer comprises an oxide of the metal.

3. The method of claim 1, wherein after the thermal treatment, the metal in the glue layer completely diffuses to the dielectric layer.

4. The method of claim 1, wherein the thermal treatment is performed at a temperature in a range between about 137° C. and about 600° C.

5. The method of claim 1 further comprising, before the thermal treatment, performing a chemical mechanical polish.

6. The method of claim 1 further comprising, after the thermal treatment, forming an etch stop layer over the dielectric layer.

7. The method of claim 1, wherein the metal in the seed layer comprises manganese (Mn).

8. The method of claim 1, wherein the metal in the seed layer comprises aluminum (Al).

9. The method of claim 1, wherein the metal alloy comprises a metal selected from the group consisting essentially of cobalt (Co), silver (Ag), aluminum (Al), zinc (Zn), calcium (Ca), gold (Au), magnesium (Mg), tungsten (W), molybdenum (Mo), nickel (Ni), chromium (Cr), and combinations thereof.

10. A method comprising:
    etching an oxygen-containing dielectric layer to form an opening;
    depositing a glue layer to a bottom and sidewalls of the opening, wherein the glue layer comprises a metal alloy;
    depositing a seed layer over the glue layer, wherein the seed layer comprises a main element and an additive metal element;
    filling the opening with a metallic material;
    performing a chemical mechanical polish (CMP) to remove portions of the glue layer, the seed layer, and the metallic material over the oxygen-containing dielectric layer;
    after the CMP, performing an annealing, wherein the annealing causes the additive metal element in the seed layer to diffuse through the glue layer, and the additive metal element reacts with the oxygen-containing dielectric layer to form a metal oxide, with the metal oxide comprising the additive metal element; and after the annealing, forming an etch stop layer over the oxygen-containing dielectric layer, the glue layer, the seed layer, and the metallic material.

11. The method of claim 10, wherein the additive metal element comprises manganese (Mn), and wherein the metal oxide comprises a manganese oxide.

12. The method of claim 10, wherein the additive metal element comprises aluminum (Al), and wherein the metal oxide comprises an aluminum oxide.

13. The method of claim 10, wherein the forming the opening comprises forming a via-hole and an upper trench over the via-hole.

14. The method of claim 10, wherein the forming the glue layer comprises physical vapor deposition.

15. The method of claim 10, wherein the annealing is performed at a temperature in a range between about 137° C. and about 600° C.

16. A method comprising:
    etching an oxygen-containing dielectric layer to form an opening;
    depositing a glue layer into the opening, wherein the glue layer comprises a metal alloy, and wherein the glue layer is in physical contact with the oxygen-containing dielectric layer;
    depositing a seed layer over and contacting the glue layer, wherein the seed layer comprises copper and an additive metal element selected from the group consisting essentially of manganese (Mn) and aluminum (Al);
    filling the opening with copper;
    performing a chemical mechanical polish (CMP) to expose the oxygen-containing dielectric layer; and
    after the CMP, performing an annealing, wherein the annealing results in the additive metal element to diffuse through the glue layer to reach the oxygen-containing dielectric layer to form a metal oxide.

17. The method of claim 16 further comprising, after the annealing, forming an etch stop layer over the oxygen-containing dielectric layer, the glue layer, and the seed layer.

18. The method of claim 16, wherein after the CMP, the additive metal element is completely diffused into the oxygen-containing dielectric layer.

19. The method of claim 16, wherein the annealing is performed at a temperature in a range between about 137° C. and about 600° C.

20. The method of claim 16, wherein the annealing is performed for a period of time in a range between about 10 minutes and about 600 minutes.

* * * * *